United States Patent [19]

Bourgeois-Moine

[11] Patent Number: 4,946,546
[45] Date of Patent: Aug. 7, 1990

[54] METHOD OF METALLIZING A SUBSTRATE OF SILICA, QUARTZ, GLASS OR SAPPHIRE

[75] Inventor: Jean-Paul Bourgeois-Moine, Paris, France

[73] Assignee: U.S. Philips Corporation, New York, N.Y.

[21] Appl. No.: 289,282

[22] Filed: Dec. 21, 1988

[30] Foreign Application Priority Data

Dec. 23, 1987 [FR] France .................. 87 18039

[51] Int. Cl.⁵ .................. B44C 1/22; C03C 15/00; C03C 25/06
[52] U.S. Cl. .................. 156/643; 156/645; 156/651; 156/663; 156/667; 204/192.3; 204/192.35; 204/192.37; 427/309
[58] Field of Search .............. 156/643, 645, 651, 654, 156/656, 663, 659.1, 667, 901; 65/31; 427/305, 307, 309; 204/192.1, 192.12, 192.3, 192.35, 192.37

[56] References Cited

U.S. PATENT DOCUMENTS 4,458,346 7/1984 Mitsuyu et al. .............. 204/192.3 X
4,642,163 2/1987 Greschner et al. .......... 204/192.3 X

FOREIGN PATENT DOCUMENTS 1419206 12/1975 United Kingdom .

OTHER PUBLICATIONS

Chemical Abstracts, vol. 106, No. 20, 1987, p. 321, No. 161376z, Sputter Plating of Copper on Quartz Plates.
Carson et al., Metallization of Glass Using Ion Injection, American Ceramic Society Bulletin, vol. 55, No. 5, 1976, pp. 530–532.

*Primary Examiner*—William A. Powell
*Attorney, Agent, or Firm*—Paul R. Miller

[57] ABSTRACT

A method of adhering a metal to a surface of a substrate of silica, quartz, glass or sapphire is set forth. The surface to be metallized is first roughened by mechanical abrasion to obtain a roughness lying between 0.2 μm and 0.7 μm and is then subjected to a chemical treatment of etching by immersion in an aqueous solution of HF. According to the invention, the method further comprises the following steps of ion etching of the surface down to a depth less than 30 nm and then applying to the surface a first metallic adherence layer by cathode sputtering.

13 Claims, 1 Drawing Sheet

METHOD OF METALLIZING A SUBSTRATE OF SILICA, QUARTZ, GLASS OR SAPPHIRE

The invention relates to a method of adhering a metal to a surface of a substrate of silica, quartz, glass or sapphire, in which the surface is first roughened by mechanical abrasion in order to obtain a surface roughness lying between 0.2 μm and 0.7 μm and is then subjected to a chemical treatment of etching by immersion for an efficacious duration in an aqueous hydrofluoric acid solution.

A specific field of use of the invention is that of thin-film hybrid circuits and v.h.f. circuits. For these types of circuits, use is frequently made for supports of substrates of alumina or substrates of silica in crystallized or amorphous form. Crystalline alumina, which is most frequently used, is very suitable for operating frequencies not exceeding about 15 GHz. Above this frequency, due to a high permittivity, the width of the metallic tracks of the circuit on alumina becomes small, i.e. of the order of 0.5 mm, which leads to the risk of these tracks being removed at the area of the connections, while for the same reason the substrate of alumina becomes very thin, i.e., of the order of 0.25 mm, as a result of which it becomes fragile and can be machined only with difficulty because of the high degree of hardness of alumina. On the contrary, an advantage of alumina for a support of v.h.f. circuits is that it can be correctly metallized by conventional methods: for example, by the cathode sputtering method preceded by the steps of cleaning, grating and degasing. It is possible to obtain forces Fp of peeling the metallic tracks exceeding 200 cN/mm, which is sufficient for the envisaged application, the disadvantage of the fragility of the material for small thicknesses at high frequencies being preponderant with respect to the disadvantage of removal of the tracks. It should be noted that, if this is the case, irrespective of the method of metallization used, for obtaining great peeling forces, a fairly high chemical affinity between alumina and certain metals used as metallization sublayer is especially required. Beside alumina substrates, substrates of silica, of quartz, of hard glass and substrates of sapphire are suitable for v.h.f. applications. The silica substrates are particularly suitable for operating frequencies exceeding 15 GHz. Such silica substrates can be machined more readily than the alumina substrates, have low dielectric losses and for the same operating frequency of the circuit to be obtained due to the small dielectric constant $\Sigma r$ equal to about 3.8 for silica as against 9.9 for alumina are less fragile because they are thicker while they have wider metallic tracks. The main technical problem arising in this case is the small adherence of the metallic layers to a substrate on the basis of silica, which results from the low chemical affinity, more precisely from the hydrophobia, between silica and metal. The known conventional methods, such as evaporation in vacuo, cathode sputtering, deposition from the gaseous phase and chemical deposition, when they are effected directly onto a substrate not subjected to particular pretreatments, provide for peeling forces of the order of 20 cN/mm, which is generally insufficient for the main envisaged application indicated above. In fact, the limitations to which the metallic tracks of the thin-film hybrid circuits can be subjected are comparable with those of printed circuits, which require peeling forces equal to or greater than 80 cN/mm.

For example, from French Utility Model No. 2 212 302 in the name of Philips, a method of metallization by chemical deposition is known, which permits obtaining peeling forces up to 55 cN/mm. According to this method, the just-mentioned chemical deposition is preceded by two steps of treating the surface of the substrate of hard glass where: the first step consists in roughening by mechanical abrasion the surface of the glass until it is given a roughness Ra lying between 0.2 and 2.5 μm. The second step then consists in treating the surface with an aqueous concentrated hydrofluoric acid solution for one or several tenths of seconds. The other steps relate to the chemical deposition decomposed into the application of a layer of nuclei and the subsequent reinforcement with metal by means of a metallization solution. This method has the advantage that it can be carried out in a simple manner and permits obtaining adherence results two to three times better than those of the conventional methods without pretreatment of the surface to be metallized. However, the adherence forces of the metallizations still prove to be insufficient for the substrates on the basis of silica and the present invention has for its object to improve further this adherence.

The main object of the invention is to cause metal to adhere to a surface of a substrate of silica, quartz, glass or sapphire in order to obtain peeling forces exceeding 80 cN/mm.

Another object of the invention is to make available a variety of metallic subjacent layers more complete than in the conventional methods.

A still further object is to obtain a better homogeneity of deposition of metallic sublayers permitting a small sublayer thickness of the order of 20 to 30 nm, which facilitates the partial removal of the sublayer by etching during the formation of any metallic configurations on the substrate.

These objects are achieved and the disadvantages according to the prior art are reduced due to the fact that the metallization method indicated in the first paragraph is characterized in that it further comprises the steps of ion etching (in a neutral medium) of the surface down to a depth smaller than 30 nm, and applying to the surface a first metallic adherence layer by cathode sputtering.

Because of the very low chemical affinity between metals and silica, or sapphire, the basic idea of the invention is to obtain before the step of metallization by cathode sputtering, as already known a state of the surface of the substrate of silica as nearly as possible to the mechanical adherence of the metal to the substrate, this surface state being only in part characterized by the final roughness Ra obtained after reactive ion etching. The kind and the aspect itself of the microscopic relief of the substrate obtained at this stage of the method then especially plays a part rather than just obtain the average depth of this relief.

A preferred embodiment of the invention is characterized in that the ion etching step (in a neutral medium) of the surface is effected by an argon plasma with a power per unit surface lying between 59 W/cm$^2$ and 71 W/cm$^2$ for a duration lying between 160 s and 200 s.

Another preferred embodiment is characterized in that it moreover comprises the subsequent step consisting in applying to the metallized surface a second metallic conductive layer by cathode sputtering, with a thickness of less than 1 μm.

The first metallic layer or sublayer, also designated as the adherence layer, is formed from a metal chosen especially because of its chemical compatibility with the substrate, such as Cr, NiCr, Ti, W or the like. Moreover, the use of NiCr permits forming integrated resistors. The second metallic layer having a thickness ten times larger than that of the sublayer does not give rise to problems of adherence to the sublayer. It is chosen because of its properties of good electrical conductivity and use is generally made of: Au, Ag or Cu. Photolithography and chemical etching or dry selective etching methods permit obtaining on metallized substrates on one surface or on both surfaces, as far as the metallic sublayer is concerned, resistant or conductive metallic configurations. In accordance with the operating frequencies chosen for the circuits, the thickness of the conductors may be more or less large, such as less than 1 $\mu$m at very high frequencies and of the order of several $\mu$m at lower frequencies.

A variation of the method according to the invention permitting obtaining metallic layers having a thickness of several $\mu$m is characterized in that it moreover comprises the subsequent step consisting in applying to the metallized surface a third metallic conductive reinforcement layer by electrolytic deposition.

Preferably, the electrolytic deposition of the third metallic layer is effected with the same metal as that of the second layer and this deposition is effected on metallic configurations adhering to the surface of the substrate.

In order that the invention may be readily understood, it will now be described more fully, by way of example, with reference to the accompanying drawings, in which.

When it is desired to form metallic layers on the surface of a substrate of glass or of quartz glass by chemical deposition in an electroless manner, it is known, before carrying out the purely chemical steps consisting in immersing the substrate successively in different solutions on the basis of metallic salts, to carry out two pretreatments having the object to treat the substrate surface so as to give it a roughness which favors the adherence of the metal deposited afterwards. These two known steps are used for carrying out the present invention for the deposition of (a) metallic layer(s) on silica, quartz, glass or sapphire and is described hereinafter with reference to FIGS. 1a, 1b, 2a and 2b.

After machining, the surface of the substrate of silica intended for thin-film hybrid circuits or v.h.f. circuits has a roughness Ra of the order of 0.3 $\mu$m. Irrespective of the method used afterwards for the metallization, it is desirable that the surface roughness of the substrate is not too high and preferably less than 1 $\mu$m to avoid excessively high losses by Foucalt high-frequency current. The first step of the method according to the invention consists in carrying out a mechanical abrasion of the surface in order to obtain a surface roughness Ra, such that:

$$0.2 \mu m < Ra < 0.7 \mu m.$$

Figure 1A:
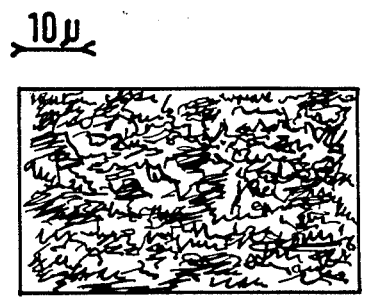
FIGS. 1a and 1b show in plan view and in lateral sectional view, respectively, the known aspect of a surface of a substrate of silica after mechanical abrasion.
Figure 1B:
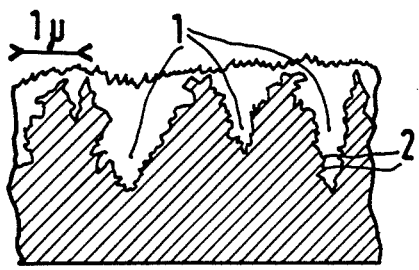

The surface is abraded, for example, by means of fine emery paper or of carborundum grains. The carborundum grains have a diameter lying between 20 and 40 $\mu$m and the treatment lasts from 60 to 180 s. The surface may also be treated by sand blasting. The result obtained is shown in FIGS. 1a and 1b, in which the respective scales of 10 $\mu$m and of 1 $\mu$m are indicated. The surface obtained has a chaotic aspect. It is constituted on the scale of 1 $\mu$m by valleys 1 in the form of a V, which cross each other. On the scale of 100 nm, a finer relief is observed, which is constituted by areas of roughnesses of about ten times finer, designated by reference numeral 2. The surface is then cleaned in a normal manner. During a first cleaning operation, designated as primary cleaning operation, detergents and solvents of a technical class are used and the surface is rinsed in flowing deionized water for 1 min. During the second cleaning operation, detergents and solvents of high purity are used; and the surface is again rinsed in flowing deionized water.

Figure 2A:
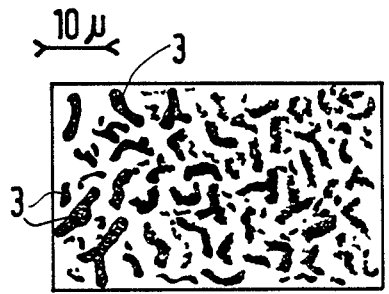
FIGS. 2a and 2b show in plan view and in lateral sectional view, respectively, the known aspect of the surface of FIGS. 1a and 1b after treatment with hydrofluoric acid.
Figure 2B:
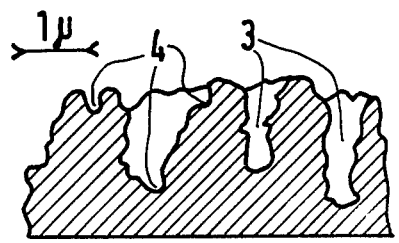

For the known second main step of the method, the cleaned and rinsed substrate is immersed in aqueous solution of concentrated hydrofluoric acid at the ambient temperature. Preferably, the concentration of HF is high, i.e. of the order of 40% by weight, for an immersion duration between 37 and 43 s, which is an effective duration. It is within the knowledge of those skilled in the art to choose weaker acid concentrations associated with longer immersion durations. The result obtained is shown in FIGS. 2a and 2b, in which the respective scales of 10 $\mu$m and 1 $\mu$m are still indicated. The roughness Ra has been increased by about 20% in such a manner that:

$$0.25 < Ra < 0.85,$$

but this small increase of the roughness practically has no influence on the adherence required for the subsequent metallization. On the contrary, it is observed that surface aspects are completely different from that of FIGS. 1a and 1b. The main relief is constituted by vermicular valleys 3. These valleys 3 are closed and have an U-shape, which is much more favourable for providing adherence than the valleys of the type 1. On the contrary, the areas of fine roughness 2 have practically been eliminated under the influence of acid and on the scale of 100 nm the surface obtained is practically smooth, apart from the formation of a few cracks 4 having a diameter of 200 to 300 nm. It should be noted that the surface aspects shown diagrammatically in FIGS. 1a and 2a can be characterized by means of an electronic scanning microscope. At this known stage of the method, the substrate is dried in a ventilated drying oven at 120° C. for 15 min.; it can then be stored for several months in a space filled with dry nitrogen of quality.

The main steps of the method according to the invention then involve causing the surface of the substrate such as obtained by the steps described above to be subjected to a process of cathode sputtering.

The substrate is first subjected to a drying process in a primary vacuum at a temperature lying between 250° and 350° C. having for its object to dehydrate the surface to be metallized. The pressure decreases from 100 mtorr to 10 mtorr in 90 seconds and is then maintained at the last-mentioned value of 10 mtorr for at least 90 seconds.

Figure 3:
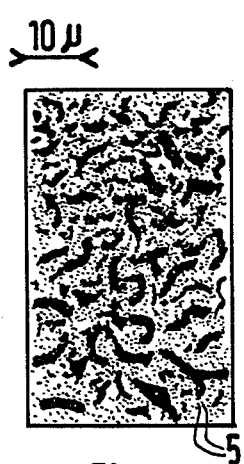
FIG. 3 shows in plan view the aspect of the surface of FIG. 2a after the step of reactive ion etching according to the invention.

Subsequently, an ion etching treatment (in a neutral medium) of the surface is carried out ("plasma etching"), which serves not to remove a substantial quantity of material from the surface, but to purify the latter on a microscopic scale of the order of a few tenths of nms. The result of this ion etching treatment is that the substrate is hollowed over a depth of at most 50 nm and influences only in a negligible manner the roughness of 0.25 to 0.85 μm obtained after treatment by HF. On the contrary, on the scale of 10 nm a microroughness is obtained as shown diagrammatically in FIG. 3, in which cavities or microcracks of about 10 to 50 nm in diameter are presented by points 5. The range of overlapping reliefs formed by the valleys 3, the cracks 4 and the cavities 5 with scales varying by an order of magnitude between one relief and the upper relief renders the surface of the substrate remarkably suitable to adhere by mechanical cohesion and constitutes the general means of the invention. The ion etching (or micro-etching) treatment can be effected in the following manner. The substrate is transferred to the space of a cathode sputtering device, preferably of the kind described hereinafter with reference to FIG. 4. The pressure in the space is first decreased until a secondary vacuum of $2 \times 10^{-7}$ torr is obtained. Argon (Ar) is then admitted into the space until a pressure of 80 mtorr is obtained and during the following operations efforts are made to maintain this pressure of 80 mtorr but for ±10%. The substrate being arranged on the cathode of the device, the potential between the electrodes is controlled so as to obtain a power per unit surface area lying between 59 W/dm$^2$ and 71 W/dm$^2$ for a duration lying between 160 and 200 s. Without special precautions being taken, since the cathode is made of copper and the part of the cathode not covered by the substrate is also bombarded by the Ar ions, copper ions are extracted from the cathode and some of these ions are redeposited on the surface of the substrate, which is detrimental to the subsequent deposition of a first metallic adherence layer depending upon the extent to which the latter preferably does not consist of copper. In order to avoid this pollution of the surface of the substrate by copper, a thin screen of silica or preferably a film having a thickness of 0.5 to 1 μm of the same metal as that which will later be used as the first metallic adherence layer can be interposed between the surface of the cathode and the back side of the substrate.

Figure 4:
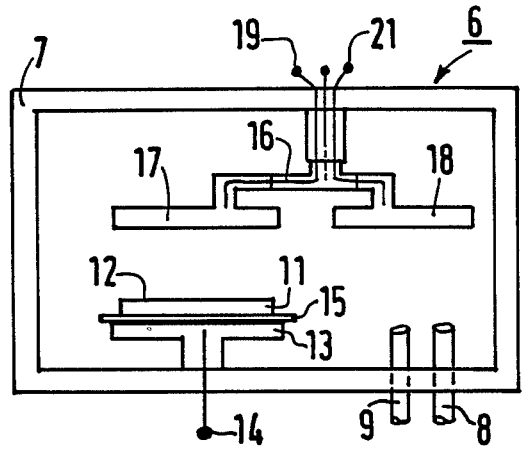
FIG. 4 shows diagrammatically the device for ion etching (in a neutral medium) and cathode sputtering used to carry out the invention.

The following steps of the method according to the invention consist in applying to the surface of the substrate one or several metallic layers by a cathode sputtering process, preferably in the same device, as shown in FIG. 4, without substantial variation of the partial pressure of 80 mtorr immediately after the step of ion etching (or micro-etching) of the surface of the substrate described in the preceding paragraph.

The device 6 of FIG. 4 comprises a space 7, through which a nozzle 8 and a nozzle 9 penetrate. The nozzle 8 serves to produce a secondary vacuum of $2 \times 10^{-7}$ torr and the nozzle 9 serves to admit argon at a pressure of 80 mtorr. The substrate 11 with its surface 12 to be metallized is arranged on an electrode 13 connected to an external electrical connection point 14. Preferably, a thin film of silica or of metal serving as sublayer 15 is interposed between the electrode 13 and the substrate 11. A multiple electrode 16 of opposite polarity is arranged opposite to the electrode 13. The electrode 16 comprises several platforms, such as 17 and 18, which can be arranged by rotation of the assembly successively in the manner of a barrel each exactly opposite to the electrode 13 at a distance of a few centimeters. Each platform of the electrode 16 is connected to an external connection point, such as 19 for the platform 17 and 21 for the platform 18, respectively.

During the step of ion etching, the platform of the electrode 13 subjected to a negative potential is a cathode and the metallic platform of the electrode 16 situated opposite thereto is an anode, the latter being subjected to a positive potential.

For the step of applying to the surface 12 a first metallic adherence layer, starting from the preceding step of ion etching, a platform of the electrode 16 is arranged opposite to the electrode 13. This platform consists preferably of Cr, NiCr, Ti or W and more generally of a metal having as far as possible a certain chemical compatibility with silica. The polarities between electrodes are inverted in such a manner that the electrode 13 becomes the anode. The operation is effected for a duration lying between 59 and 73 seconds with a power per unit surface area lying between 79 and 95 W/dm$^2$ in such a manner that a metallic sublayer having a thickness of 15 to 30 nm is deposited on the surface 12 from the metal extracted from the platform of the electrode 16, i.e. a very small thickness comparable with the thickness of silica extracted during the preceding ion etching step. It should be noted that, if at this stage of the method instead of metallic deposition by cathode sputtering chemical deposition by curing in baths containing metallic salts should be used, the thickness of the sublayer, which can less readily be controlled in the latter case, would lead to considerably higher sublayer thicknesses of the order of 100 to 150 nm. According to a variation, in order to accelerate the metallic particles towards the surface 12, magnetron cathode sputtering may be used. The application of NiCr with later metallic deposition permits obtaining resistors on the substrate 11. It should be noted that cathode sputtering permits a fairly wide choice for the metal from which the sublayer is formed.

In order to obtain metallic conductive layers, a second metallic conductive layer can then be applied by cathode sputtering. This second layer is thicker than the first layer which is designated as a sublayer; and it is of the order of several tenths of mms thickness and lies typically between 300 and 400 nm thickness, which results in that the cracks 4 and the valleys 3 of FIG. 2b are filled up. For the application of this second metallic layer, the elctrode 16 is turned after the application of the first metallic layer in such a manner that a platform suitable for the application of the second metallic layer is presented opposite to the anode 13 and that the connection connected to this platform is brought to an adequate negative potential, this latter platform preferably consisting of Au, Ag or Cu. In order to obtain the required thickness, a reference potential for producing a power per unit surface area lying between 118 W/dm$^2$ and 142 W/dm$^2$ is applied between the active electrodes for a duration of the order of 5 to 7 mn. For high frequencies, higher than 10 GHz, the small thicknesses less than 0.5 μm for the second metallic layer, can be obtained by cathode sputtering.

According to a variation, as the case may be, a barrier layer or diffusion layer, preferably of Ni, may be applied in known manner, again by cathode sputtering, between the first and second metallic layers.

At this stage of the method, a substrate of silica (or of quartz or sapphire) is obtained which is metallized on the entire surface, the metallization comprising at least a first layer or sublayer and a second layer or conductive layer. In general, the metallization of the second surface is realized in the same manner. The metallizations of the slices or edges are also realized, except if adapted covers or the like are envisaged. The choice is made as a function of the presence or the absence of connections between surfaces. For this reason, the expression "metallization of a substrate surface" is to be understood to mean in the whole text the metallization of one surface of the two surfaces or of the two surfaces and the edges of the substrate. For the realization of metallic configurations, the substrate is extracted from the space 7 of the device 6 and conventional photolithographic methods permit obtaining the desired configurations. For this reason it should be noted that the small roughness of the surface, i.e. of the order of Ra=0.5 μm, suitable for high frequencies for a minimization of the losses by Foucault currents, facilitates the chemical etching treatment serving to eliminate the metal on the parts of the surface of the substrate which have to remain insulating and which constitute the complement of the parts occupied by the configurations.

When the electronic circuits to be formed on the substrate are provided for fairly low operating frequencies in order that the skin effect does not occur and that the whole thickness of the metallic layers contributes to the electrical conduction, a layer having a thickness of several microns may be necessary. A larger thickness of the order of several tenths of microns may also be required for the deposition of metallic tracks on silica, these tracks being intended for later peeling tests. These large thicknesses may be obtained by electrolytic reinforcement, which constitutes any deposition of a third metallic conductive layer. Preferably, the electrolytic deposition is carried out on metallic configurations adhering to the substrate rather than on the wholly metallized surface of the substrate.

Certain metallic configurations of thin-film hybrid circuits or of v.h.f. circuits comprise both resistors and conductors on the same substrate of silica. In this case, the substrate to be metallized in accordance with the method according to the invention is extracted from the space of the cathode sputtering device after the application of the first metallic adherence layer, which in this case is made of NiCr. Subsequently, metallic configurations for the resistors and the conductors are formed by photolithography on the surface; and among these configurations, those intended for the resistors are covered by resin resistant to the subsequent step(s) of metallic deposition by cathode sputtering; subsequently, the deposition of conductive metal by cathode sputtering with electrolytic reinforcement, as the case may be, may be effected in the manner described above.

The method according to the invention can be applied for the realization of metallic conductive surface configurations on integrated circuits when the latter comprise an external passivation layer formed from silica.

The peeling forces which can be attained by the use of the invention, these forces being measured by means of precise tests by removal of metallic strips having a width of 0.5 mm, 1 mm and 2 mm deposited on silica, quartz or sapphire, as described above, reach high values exceeding 80 cN/mm and are typically equal to 120 cN/mm.

What is claimed is:

1. A method of adhering a metal to a surface of a substrate of silica, quartz, glass or sapphire, in which the surface is first roughened by mechanical abrasion in order to obtain a surface roughness lying between 0.2 μm and 0.7 μm and is then subjected to a chemical treatment of etching by immersion in an aqueous hydrofluoric acid solution, characterized in that it further comprises the subsequent steps of ion etching (in a neutral medium) of the surface down to a depth smaller than 30 nm, and applying to the surface a first metallic adherence layer by cathode sputtering.

2. A method as claimed in claim 1, characterized in that the ion etching step is effected by an argon plasma with a power per unit surface lying between 59 W/dm$^2$ and 71 W/dm$^2$ for a duration lying between 160 s and 200 s.

3. A method as claimed in claim 1 or 2, characterized in that during the step of ion etching of the surface a thin film of material of the first metallic adherence layer is interposed between the said substrate and an electrode serving as a support for the substrate.

4. A method as claimed in claim 3, characterized in that it moreover comprises the subsequent step consisting in applying to the metallized surface a second metallic conductive layer by cathode sputtering, whose thickness is less than 0.5 μm.

5. A method as claimed in claim 4, characterized in that it moreover comprises the subsequent step consisting in applying to the metallized surface a third metallic conductive reinforcement layer by electrolytic deposition.

6. A method as claimed in claim 1, characterized in that said first metallic adherence layer is of Cr, NiCr, Ti or W and a second and a third metallic conductive layer of Au, Ag, or Cu are provided at the surface of the substrate.

7. A method as claimed in claim 2, characterized in that it moreover comprises the subsequent step consisting in applying to the metallized surface a second metallic conductive layer by cathode sputtering, whose thickness is less than 0.5 μm.

8. A method as claimed in claim 7, characterized in that it moreover comprises the subsequent step consisting in applying to the metallized surface a third metallic conductive reinforcement layer by electrolytic deposition.

9. A method as claimed in claim 1, characterized in that it moreover comprises the subsequent step consisting in applying to the metallized surface a second metallic conductive layer by cathode sputtering, whose thickness is less than 0.5 μm.

10. A method as claimed in claim 9, characterized in that it moreover comprises the subsequent step consisting in applying to the metallized surface a third metallic conductive reinforcement layer by electrolytic deposition.

11. A method as claimed in claim 2, characterized in that said first metallic adherence layer is of Cr, NiCr, Ti or W and a second and a third metallic conductive layer of Au, Ag or Cu are provided at the surface of the substrate.

12. A method as claimed in claim 3, characterized in that said first metallic adherence layer is of Cr, NiCr, Ti or W and a second and a third metallic conductive layer of Au, Ag or Cu are provided at the surface of the substrate.

13. A method as claimed in claim 4, characterized in that said first metallic adherence layer is of Cr, NiCr, Ti or W and a second and a third metallic conductive layer of Au, Ag or Cu are provided at the surface of the substrate.

* * * * *